United States Patent
Panteleev et al.

(10) Patent No.: US 8,700,969 B2
(45) Date of Patent: Apr. 15, 2014

(54) RECONFIGURABLE ENCODING PER MULTIPLE COMMUNICATIONS STANDARDS

(75) Inventors: Pavel A. Panteleev, Moscow (RU);
Elyar E. Gasanov, Moscow (RU); Ilya V. Neznanov, Moscow (RU); Andrey P. Sokolov, Moscow (RU); Yurii S. Shutkin, Moscow (RU)

(73) Assignee: LSI Corporation, San Jose, CA (US)

( * ) Notice: Subject to any disclaimer, the term of this patent is extended or adjusted under 35 U.S.C. 154(b) by 320 days.

(21) Appl. No.: 13/116,253

(22) Filed: May 26, 2011

(65) Prior Publication Data
US 2012/0137190 A1   May 31, 2012

(30) Foreign Application Priority Data
Nov. 25, 2010   (RU) .................................. 2010147930

(51) Int. Cl.
*H03M 13/00*   (2006.01)

(52) U.S. Cl.
USPC ........................................................ 714/752

(58) Field of Classification Search
USPC ................. 714/752, 755, 786, 751, 746
See application file for complete search history.

(56) References Cited

U.S. PATENT DOCUMENTS

| | | | |
|---|---|---|---|
| 5,991,308 A * | 11/1999 | Fuhrmann et al. | 370/395.53 |
| 7,536,624 B2 | 5/2009 | Eroz et al. | 714/755 |
| 8,261,168 B2 * | 9/2012 | Wang et al. | 714/790 |

OTHER PUBLICATIONS

Berrou, Claude et al., Near Shannon Limit Error—Correcting Coding and Decoding: Turbo-Codes (1), IEEE, pp. 1064-1070, copyright 1993.

* cited by examiner

*Primary Examiner* — Phung M Chung
(74) *Attorney, Agent, or Firm* — Christopher P. Maiorana, PC

(57) ABSTRACT

An apparatus generally including a first circuit and a second circuit. The first circuit may be configured to (i) receive a configuration signal that identifies a current one of a plurality of communications standards and (ii) generate a plurality of matrix elements based on the configuration signal. The second circuit may include a plurality of matrixes. The second circuit may be configured to (i) fill the matrixes with the matrix elements and (ii) generate an encoded signal by forward error correction encoding an input signal using the matrixes. The encoded signal generally complies with the current communications standard.

20 Claims, 6 Drawing Sheets

US 8,700,969 B2

RECONFIGURABLE ENCODING PER MULTIPLE COMMUNICATIONS STANDARDS

This application claims the benefit of Russian Application No. 2010147930, filed Nov. 25, 2010 and is hereby incorporated by reference in its entirety.

FIELD OF THE INVENTION

The present invention relates to forward error correction codes generally and, more particularly, to a method and/or apparatus for implementing reconfigurable encoding per multiple communications standards.

BACKGROUND OF THE INVENTION

Turbo and convolutional codes are widely used forward error correction codes. Turbo codes were proposed by Berrou and Glavieux in 1993 and have been adopted in many communications standards such as Wideband-CDMA (WCDMA), Code Division Multiple Access 2000 (CDMA2000), Worldwide Interoperability for Microwave Access (WiMAX), Long Term Evolution (LTE) and Digital Video Broadcasting-Return Channel via Satellite (DVB-RCS). The codes allow near optimal decoding with excellent performance approaching the Shannon limit for Additive White Gaussian Noise (AWGN) channels.

Conventional implementations of convolutional and turbo encoders handle a single input bit per clock cycle. If a conventional encoder simultaneously supports many different standards, straightforward implementations utilize a significant amount of additional configuration data. Moreover, the configuration data is prepared outside the encoder and loaded into internal registers when the encoder is initialized. If the configuration data is sufficiently long, many clock cycles are used to configure the encoder.

SUMMARY OF THE INVENTION

The present invention concerns an apparatus generally including a first circuit and a second circuit. The first circuit may be configured to (i) receive a configuration signal that identifies a current one of a plurality of communications standards and (ii) generate a plurality of matrix elements based on the configuration signal. The second circuit may include a plurality of matrixes. The second circuit may be configured to (i) fill the matrixes with the matrix elements and (ii) generate an encoded signal by forward error correction encoding an input signal using the matrixes. The encoded signal generally complies with the current communications standard.

The objects, features and advantages of the present invention include providing apparatus for implementing reconfigurable encoding per multiple communications standards that may (i) be used for any particular set of wireless communications standards, (ii) reconfigure in a single clock cycle, (iii) implement hardware-only reconfiguration, (iv) handle several input bits per clock cycle, (v) implement a convolutional encoder, (vi) implement a turbo encoder, (vii) occupy an area close to a non-configurable encoder and/or (viii) perform with a throughput close to a non-configurable encoder.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Some embodiments of the present invention generally concern a reconfigurable chip (or die) for encoding an input signal in accordance with two or more wireless communications standards. The wireless communications standards may include, but are not limited to, a Long Term Evolution (LTE) standard (3GPP Release 8), an Institute of Electrical and Electronics Engineering (IEEE) 802.16 standard (WiMAX), a Wideband-CDMA/High Speed Packet Access (WCDMA/HSPA) standard (3GPP Release 7) and a CDMA-2000/Ultra Mobile Broadband (UMB) standard (3GPP2). Other wired and/or wireless communications standards may be implemented to meet the criteria of a particular application.

Instead of using a separate scheme for each wireless communications standard, the standards may be supported by hardware-only reconfiguration. For each standard, a specific configuration code generally controls the generation of matrix elements for multiple matrixes. The matrixes may be used in the manipulation of the input bits to generate an encoded signal. The resulting encoder may handle several input bits per clock cycle. Furthermore, reconfiguration from a current communications standard to another communications standard may be achieved in a single clock cycle.

Figure 1:
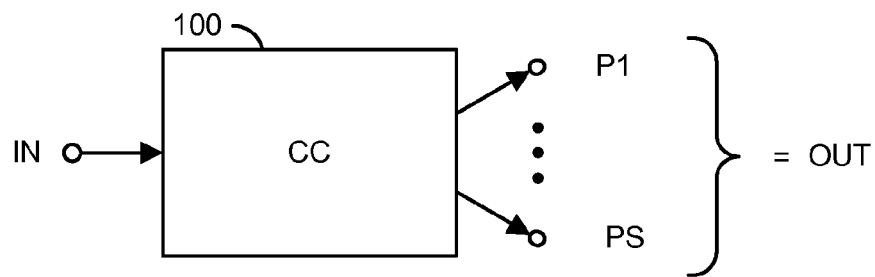
FIG. 1 is a block diagram of a convolutional rate 1/s encoder.

Referring to FIG. 1, a block diagram of an apparatus 100 is shown. The apparatus (or device or circuit) 100 may implement a convolutional rate 1/s encoder. A signal (e.g., IN) may be received by the apparatus 100. A signal (e.g., OUT) may be generated by the apparatus 100 in response to the signal IN. The apparatus 100 may represent one or more modules and/or blocks that may be implemented as hardware, firmware, software, a combination of hardware, firmware and/or software, or other implementations.

The signal IN may convey an information word received by the apparatus 100. The information word "d" (e.g., data to be transmitted) may be described by formula 1 as follows:

$$d = (d_1, \ldots, d_k) \in \{0,1\}^k \quad (1)$$

where each $d_i \in \{0,1\}$ may be an information bit and parameter "k" may be an information word length. The apparatus 100 generally adds redundancy to the information word d and produces a codeword "c" in the signal OUT. Codeword c is generally illustrated by formula 2 as follows:

$$c = (c_1, \ldots, c_n) \in \{0,1\}^n \quad (2)$$

where "n" is the codeword length and $R = k/n$ may be a code rate.

For convolutional rate 1/s, the apparatus 100 may be defined by a transfer matrix T. Transfer Matrix T is generally shown in formula 3 as follows:

$$T = [t_1(D), \ldots, t_s(D)] \quad (3)$$

where each ti(D) (e.g., formula 4):

$$t_i D = \frac{h^{(i)}(D)}{g^{(i)}(D)} \in F_2(D) \quad (4)$$

may be a rational function in variable D over the binary field $F_2=\{0,1\}$. The elements $h(i)(D), g(i)(D) \in F_2(D)$ may be polynomials in D with coefficients in $F_2$ and $h(i)(0)=g(i)(0)=1$. When the apparatus 100 receives the signal IN carrying an infinite binary sequence (e.g., formula 5):

$$d = d_1, d_2, \ldots, d_i, \ldots \quad (5)$$

the signal IN may be interpreted as a formal power series per formula 6 as follows:

$$d(D) = d_1 + d_2 D + \ldots + d_i D^{i-1} + \ldots \quad (6)$$

The apparatus 100 may generate multiple signals (e.g., P1 to PS). A combination of the signals P1 to PS may form the signal OUT. Each signal P1 to PS may carry a sequence (e.g., p(1) to p(s)) as shown in formulae 7 as follows:

$$p^{(1)} = p_1^{(1)}, p_2^{(1)}, \ldots, p_i^{(1)}, \ldots$$
$$\vdots \quad (7)$$
$$p^{(s)} = p_1^{(s)}, p_2^{(s)}, \ldots, p_i^{(s)}, \ldots$$

The sequences may be considered as formal power series and calculated as shown in formulae 8 as follows:

$$p^{(1)}(D) = t_1(D) \cdot d(D),$$
$$\vdots \quad (8)$$
$$p^{(s)}(D) = t_s(D) \cdot d(D),$$

The resulting codeword c may be represented by formula 9 as follows:

$$c = (p_1^{(1)}, \ldots, p_1^{(s)}, p_2^{(1)}, \ldots, p_2^{(s)}, \ldots, p_k^{(1)}, \ldots, p_k^{(s)}), \quad (9)$$

where p(j) (e.g., formula 10):

$$p^{(j)} = (p_1^{(j)}, \ldots, p_k^{(j)}) \quad (10)$$

may be the j-th element created by the convolutional encoding. The word p(j) may be referred to as a parity word.

In the case of convolutional codes (CC) generally used in wireless standards, the channel encoding is generally not systematic (e.g., the encoding may have a polynomial transfer matrix). In the case of convolutional turbo codes (CTC), the encoding may be systematic (e.g., the information word d may be a part of the codeword c).

Figure 2:
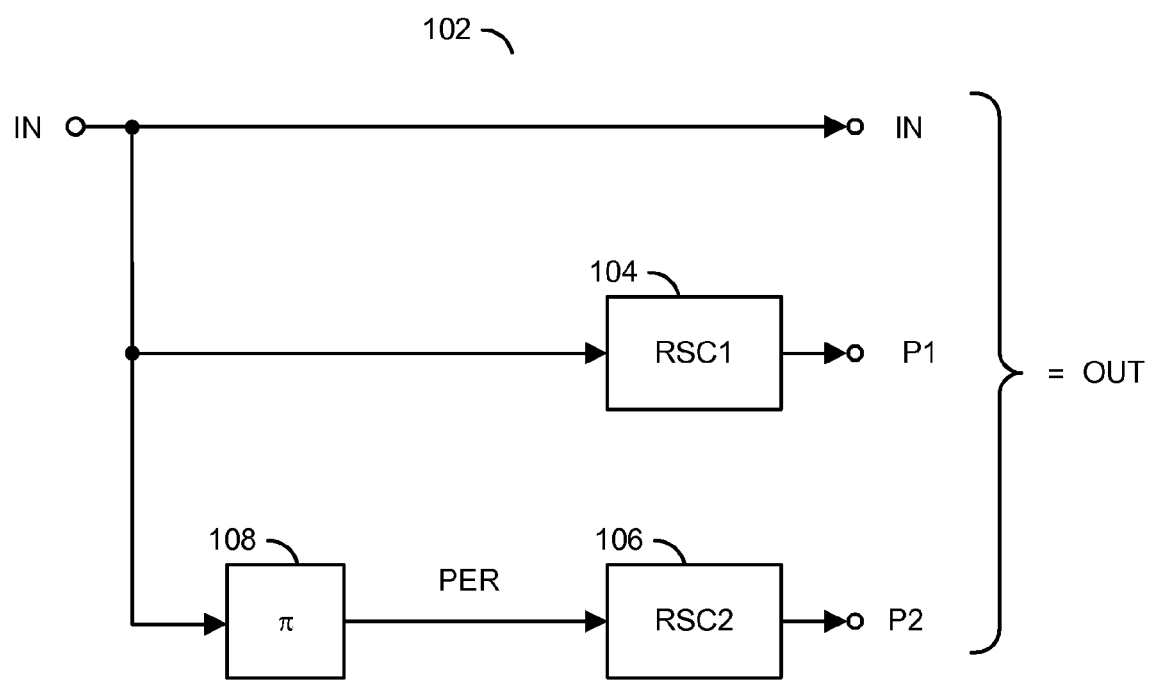
FIG. 2 is a block diagram of a convolutional turbo rate 1/3 encoder.

Referring to FIG. 2, a block diagram of an apparatus 102 is shown. The apparatus (or device or circuit) 102 may implement a convolutional turbo rate 1/3 encoder. The apparatus 102 generally comprises a circuit (or module) 104, a circuit (or module) 106 and a circuit (or module) 108. The signal IN may be received by the circuits 104 and 108. A signal (e.g., PER) may be generated by the circuit 108 and received by the circuit 106. The circuit 104 may generate the signal P1. The circuit 106 may generate the signal P2. A combination of the signals IN, P1 and P2 may establish the signal OUT. The circuits 104 to 108 may represent modules and/or blocks that may be implemented as hardware, firmware, software, a combination of hardware, firmware and/or software, or other implementations.

The circuit 104 may implement a Recursive Systematic Convolutional (RSC) encoder. The circuit 104 is generally operational to encode the information word d generate the parity word p(1). The information word d may be received in the signal IN. The parity word p(1) may be presented in the signal P1. The encoding may be a recursive systematic convolutional encoding.

The circuit 106 may implement another RSC encoder. The circuit 106 is generally operational to encode a permuted word π(d) (e.g., formula 11) as follows:

$$\pi(d) = (d_{\pi(1)}, \ldots, d_{\pi(k)}) \quad (11)$$

to generate the parity word p(2). The permuted word π(d) may be received in the signal PER from the circuit 108. The parity word p(2) may be presented in the signal P2. The encoding may also be a recursive systematic convolutional encoding. The circuit 106 may be a duplicate of the circuit 104 and perform the same encoding technique.

The circuit 108 may implement an interleaver circuit. The circuit 108 is generally operational to generated the permuted word Π(d) by permutating the information word d. The information word d may be received in the signal IN. The permuted word Π(d) may be presented to the circuit 106 in the signal PER.

Each standard LTE, W-CDMA/HSPA and WiMAX may include rate 1/3 turbo codes. In the WiMAX standard, the codeword c may be given by formula 12 as follows:

$$c = (d_1, p_1^{(1)}, p_1^{(2)}, \ldots, d_k, p_k^{(1)}, p_k^{(2)}), \quad (12)$$

where n=3k and tail-biting may be utilized. In the LTE standard and the W-CDMA/HSPA standard, the codeword c is generally illustrated by formula 13 as follows:

$$c = (d_1, p_1^{(1)}, p_1^{(2)}, \ldots, d_k, p_k^{(1)}, p_k^{(2)}, t_1, \ldots, t_{12}), \quad (13)$$

where n=3k+12 and the final several bits (e.g., 12 bits $t_1, \ldots, t_{12}$) may be used for trellis termination. The trellis termination generally forces the apparatus 102 to an initial zero state. In the case of trellis termination, the actual code rate k/(3k+12) may be a little smaller than the rate 1/3.

In the above cases, the parity word p(1) in the signal P1 may convey the parity bits word obtained for an unpermuted information word d generated by the circuit 104. The parity word p(2) may be obtained for the permuted word π(d) generated by the circuit 108. An operation n may be a permutation on a set {1, 2, . . . , k} specified by an interleaver table of the standard.

Figure 3:
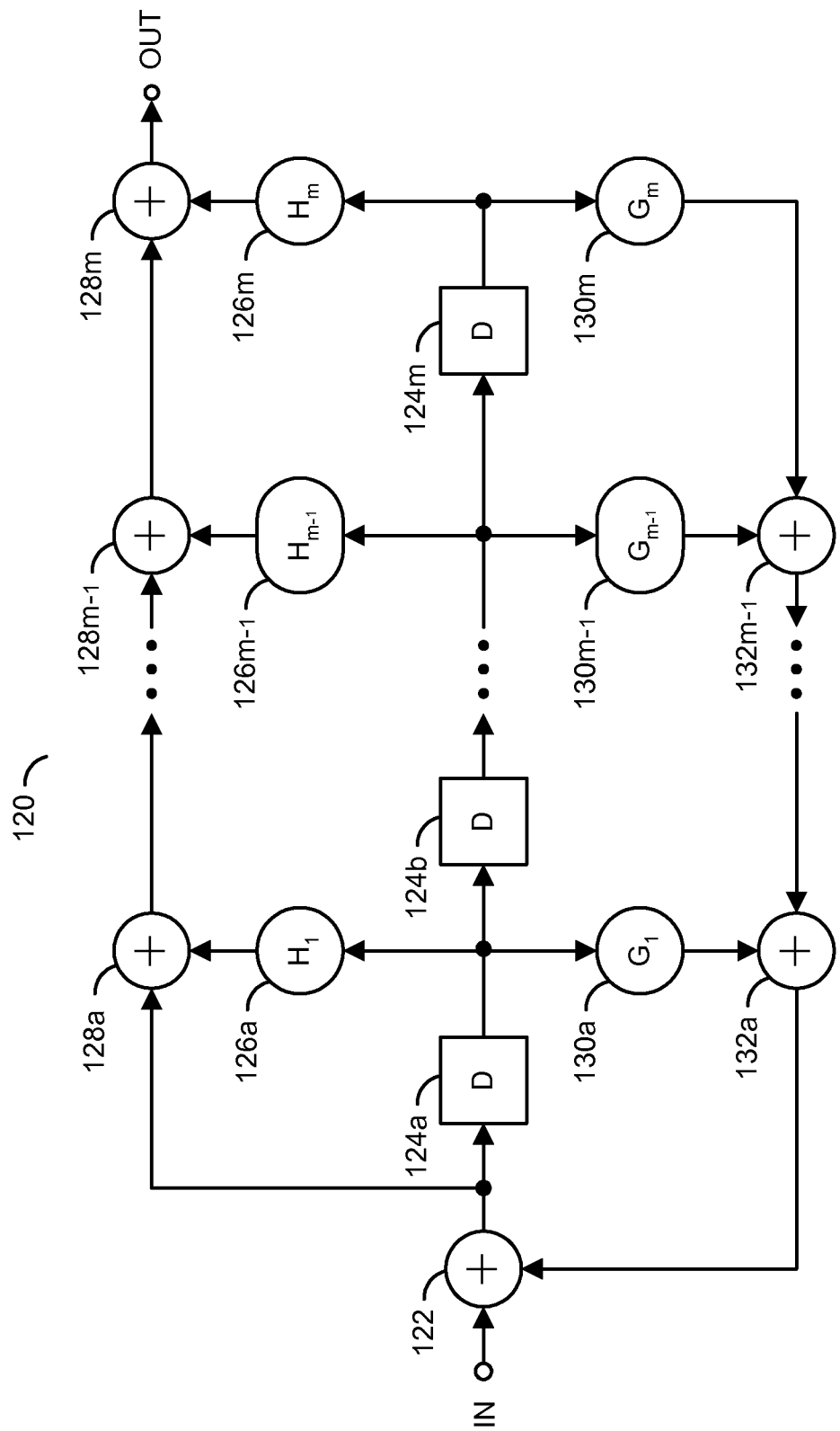
FIG. 3 is a block diagram of a rate 1 convolutional encoder.

Referring to FIG. 3, a block diagram of an apparatus 120 is shown. The apparatus (or device or circuit) 120 may implement a rate 1 convolutional encoder. The apparatus 120 generally represents a scheme for an RSC encoder. The apparatus 120 generally comprises a circuit (or module) 122, multiple circuits (or modules) 124a to 124m, multiple circuits (or modules) 126a to 126m, multiple circuits (or module) 128a to 128m, multiple circuits (or modules) 130a-130m and multiple circuits (or modules) 132a to 132m−1. The circuit 122 may receive the signal IN. The circuit 128m may generate and present the signal OUT. The circuits 122 to 132m−1 may represent modules and/or blocks that may be implemented as hardware, firmware, software, a combination of hardware, firmware and/or software, or other implementations.

The circuit 122 may present a signal to the circuit 124a and the circuit 128a. Each circuit 124a to 124m−1 may present a signal to the next respective circuit 124b to 124m, respective circuit 126a to 126m−1 and a respective circuit 130a to 130m-1. The circuit 124m may present a signal to the circuits 126m and 130m. Each circuit 126a to 126m may present a signal to a respective circuit 128a to 128m. Each circuit 128a to 128m-1 may present a signal to a respective next circuit 128b to 128m. Each circuit 130a to 130m-1 may present a signal to a respective circuit 132a to 132m-1. The circuit 130m may also present a signal to the circuit 132m-1. Each circuit 132b to 132m-1 may present a signal to a respective previous circuit 132a to 132m-2. The circuit 132a may present a signal back to the circuit 122.

Each circuit 122, 128a to 128m and 132a to 132m-1 may implement an adder circuit. The circuits 122, 128a to 128m and 132a to 132m-1 are generally operational to generate a sum at an output port of two values received at the respective input ports.

Each circuit 124a to 124m may implement a delay circuit (e.g., register). The circuit 124a-124m may be operational to buffer a received value for a single clock cycle.

Each circuit 126a to 126m may implement a transfer circuit. The circuit 126a to 126m may be operational to transfer an input value to an output value per a respective polynomial (e.g., $H_1$ to Hm).

Each circuit 130a to 130m may implement another transfer circuit. The circuit 130a to 130m may be operational to transfer an input value to an output value per a respective polynomial (e.g., $G_1$ to Gm).

A number of additional rates may be easily obtained by applying puncturing. Puncturing generally deletes some of the parity symbols according to a puncturing scheme defined in each standard.

In a general case, a convolutional rate k/n encoder (e.g., k input bits and n output bits may be defined by a transfer matrix T). An example transfer matrix T is generally shown in formula 14 as follows:

$$T = \begin{pmatrix} t_{11}(D) & t_{12}(D) & \ldots & t_{1k}(D) \\ t_{21}(D) & t_{22}(D) & \ldots & t_{2k}(D) \\ \vdots & \vdots & & \vdots \\ t_{n1}(D) & t_{n2}(D) & \ldots & t_{nk}(D) \end{pmatrix} \quad (14)$$

where each tij(D) (formula 15):

$$t_{ij}(D) = \frac{H_{ij}(D)}{G_{ij}(D)} \in F_2(D) \quad (15)$$

is generally a rational function in variable D. The elements Hij(D) and Gij(D) may polynomials in D with coefficients in $F_2$ and Hij(0)=Gij(0)=1. When an encoder is fed by the k-input infinite binary sequences in the signal IN (e.g., formula 16):

$$IN = [x^{(1)}, \ldots, x^{(k)}] \quad (16)$$

each sequence x(i) (formula 17):

$$x^{(i)} = x_0^{(i)} x_1^{(i)} \quad (17)$$

may be interpreted as formal power series as illustrated in formula 18 as follows:

$$x^{(i)}(D) = x_0^{(i)} + x_1^{(i)} D + \ldots \quad (18)$$

Hence, the signal OUT of the encoder may be given by formula 19 as follows:

$$OUT = [y^{(1)}(D), \ldots, y^{(n)}(D)] \quad (19)$$

where matrix y may be defined by the formula 20 as follows:

$$\begin{bmatrix} y^{(1)}(D) \\ y^{(2)}(D) \\ \vdots \\ y^{(n)}(D) \end{bmatrix} = \begin{pmatrix} t_{11}(D) & t_{12}(D) & \ldots & t_{1k}(D) \\ t_{21}(D) & t_{22}(D) & \ldots & t_{2k}(D) \\ \vdots & \vdots & & \vdots \\ t_{n1}(D) & t_{n2}(D) & \ldots & t_{nk}(D) \end{pmatrix} \begin{bmatrix} x^{(1)}(D) \\ x^{(2)}(D) \\ \vdots \\ x^{(k)}(D) \end{bmatrix} \quad (20)$$

Figure 4:
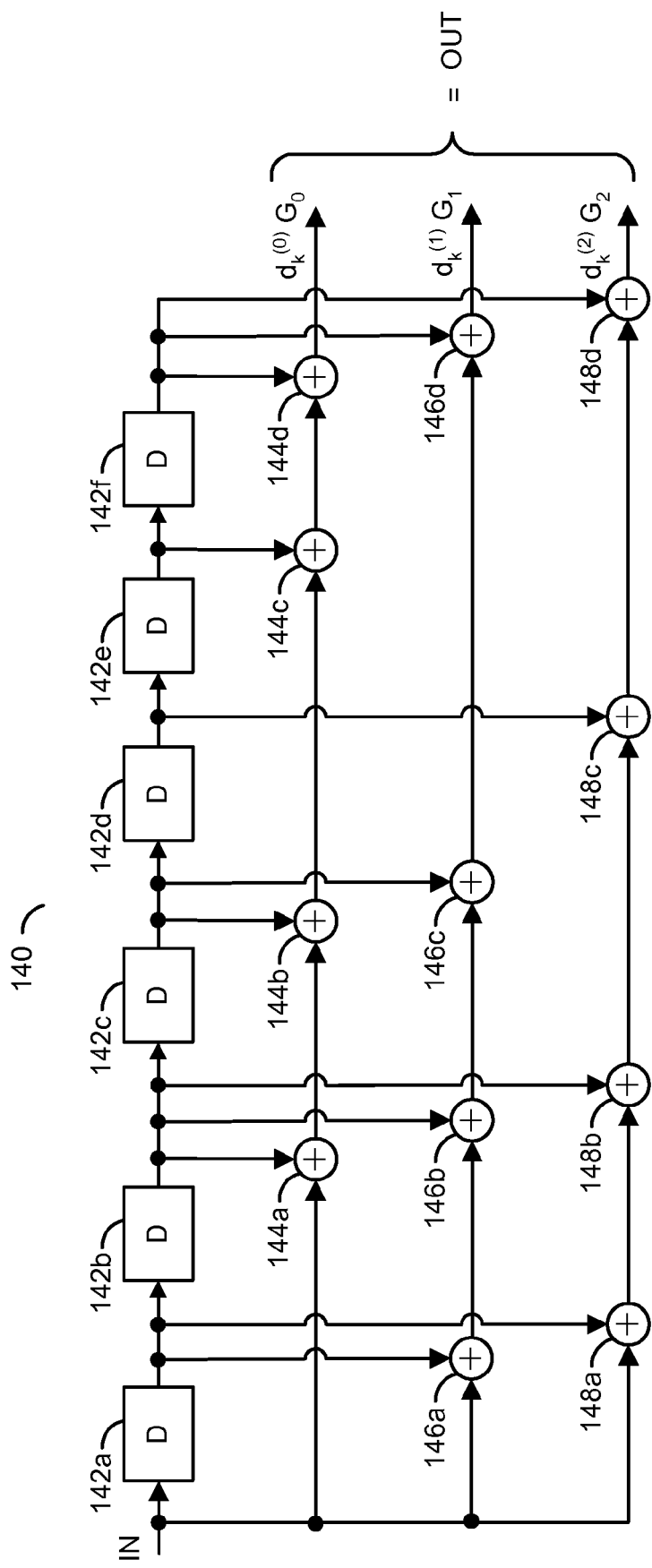
FIG. 4 is a block diagram of a rate 1/3 LTE convolutional encoder.

Referring to FIG. 4, a block diagram of an apparatus 140 is shown. The apparatus (or device or circuit) 140 may implement a rate 1/3 LTE convolutional encoder. The apparatus 140 generally comprises multiple circuits (or module) 142a to 142f, multiple circuits (or modules) 144a to 144d, multiple circuits (or modules) 146a to 146d and multiple circuits (or modules) 148a to 148d. The circuit 142a may receive the signal IN. The circuits 144d, 146d and 148d combined may generate and present the signal OUT. The circuits 142a to 148d may represent modules and/or blocks that may be implemented as hardware, firmware, software, a combination of hardware, firmware and/or software, or other implementations.

Each circuit 142a to 142f may implement a delay circuit (e.g., register). The circuit 142a to 142f may be operational to buffer a received value for a single clock cycle. Each circuit 144a to 148d may implement an adder circuit. The circuits 144a to 148d are generally operational to generate a sum at an output port of two values received at the respective input ports.

Figure 5:
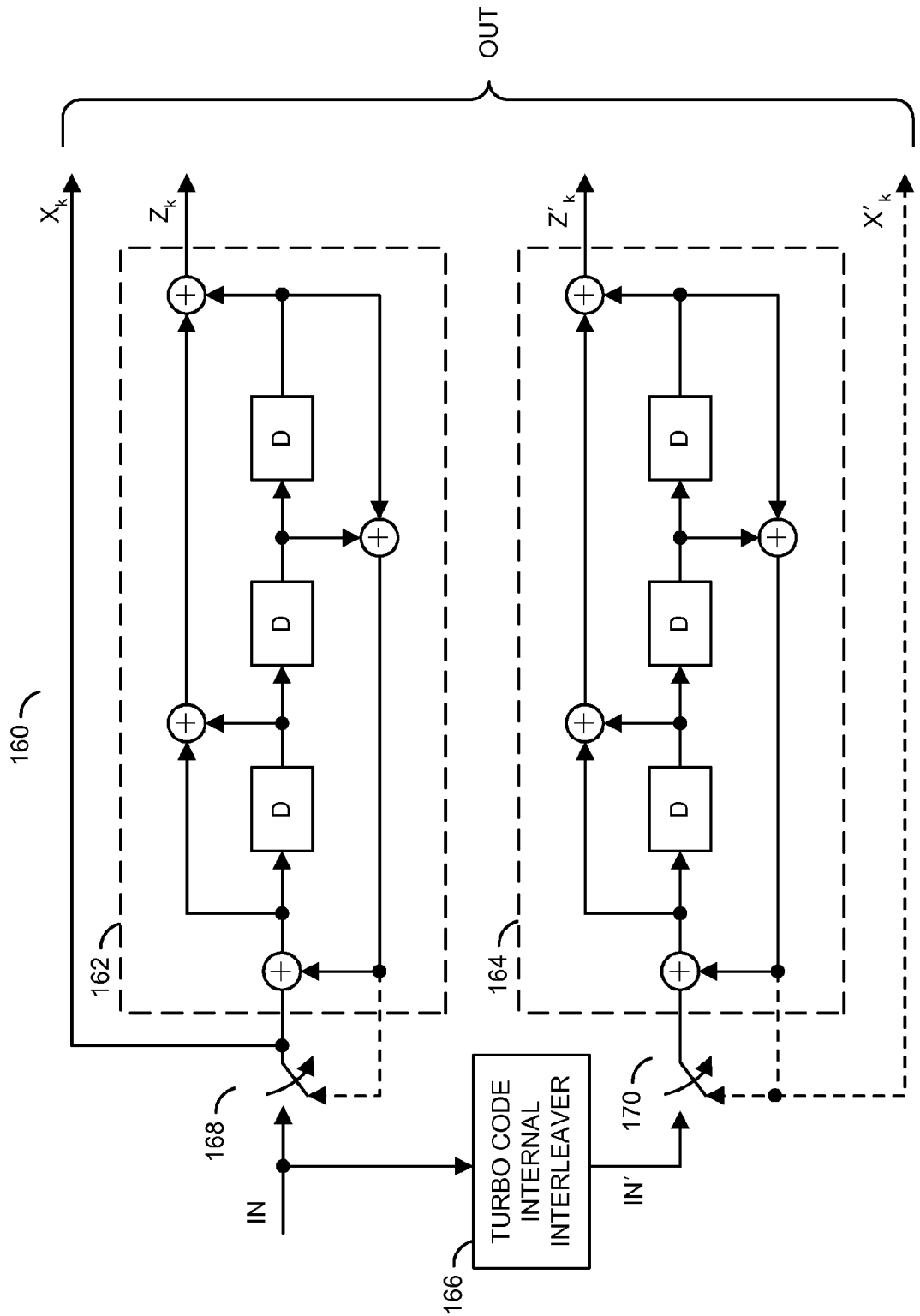
FIG. 5 is a block diagram of a rate 1/3 LTE turbo encoder.

Referring to FIG. 5, a block diagram of an apparatus 160 is shown. The apparatus (or device or circuit) 160 may implement a rate 1/3 LTE turbo encoder. The apparatus 160 generally comprises a circuit (or module) 162, a circuit (or module) 164, a circuit (or module) 166, a circuit (or module) 168 and a circuit (or module) 170. The circuits 166 and 168 may receive the signal IN. A signal (e.g., IN') may be generated by the circuit 166 and presented to the circuit 164. The circuits 162, 164, 168 and 170 combined may generate and present the signal OUT. The circuits 162 to 170 may represent modules and/or blocks that may be implemented as hardware, firmware, software, a combination of hardware, firmware and/or software, or other implementations. The dotted lines may be included in designs that include trellis termination.

The circuit 162 may implement a constituent decoder circuit. The circuit 162 is generally operational to generate a portion of the signal OUT by encoding the signal IN. The circuit 164 may implement another constituent decoder circuit. The circuit 164 is generally operational to generate a portion of the signal OUT by encoding the signal IN'. In some embodiments, the circuit 164 may be a copy of the circuit 162. The circuit 166 may implement an interleaver circuit. The circuit 166 is generally operational to generate the signal IN' by permuting (interleaving) the signal IN.

Each circuit 168 and 170 may implement a switch. The circuit 168 may switch an input signal into the circuit 162 between the signal IN and a feedback signal of the circuit 162. The circuit 170 may switch an input signal into the circuit 164 between the signal IN' and a feedback signal of the circuit 164.

Consider a general rate 1/s code in the following. In a simple case where n=k=1 (e.g., FIG. 3), the output vector Y(D) may be given by formula 21 as follows:

$$Y(D) = \frac{h(D)}{g(D)} X(D) \quad (21)$$

where h(D) is generally given by formula 22 as follows:

$$h(D) = h_0 + h_1 D + \ldots + h_m D^m \quad (22)$$

and g(D) is given by formula 23 as follows:

$$g(D) = g_0 + g_1 D + \ldots + g_m D^m \quad (23)$$

Generally, h0=g0=1. A vector (e.g., q(t) formula 24):

$$q(t) = [q_1(t), \ldots, q_m(t)] \in F_2^m \quad (24)$$

may represent an encoder state, the vector $X(t) \in F_2$ may be an input (e.g., signal IN) and the vector $Y(t) \in F_2$ an output (e.g., signal OUT) at the moment at t=0, 1, 2, 3, etc. If an initial state q(0) of the encoder is given by formula 25 as follows:

$$q^{(0)}[q_1^{(0)}, \ldots, q_m^{(0)}] \in F_2^m \quad (25)$$

the encoder may work as described by formulae 26 as follows:

$$\begin{cases} q_1(0) &= q_1^{(0)}, \\ &\vdots \\ q_m^{(0)} &= q_m^{(0)}, \\ q_1(t+1) &= g_1 q_1(t) + \ldots + g_m q_m(t) + x(t), \\ q_2(t+1) &= q_1(t), \\ &\vdots \\ q_m(t+1) &= q_{m-1}(t), \\ y(t) &= h_0 x(t) + h_1 q_1(t) + \ldots + h_m q_m(t), \end{cases} \quad (26)$$

In matrix form, the operation of the encoder may be described by formulae 27 as follows:

$$\begin{cases} q(0) &= q^{(0)}, \\ q(t+1) &= G \cdot q(t) + e_1 x(t), \\ y(t) &= H \cdot q(t) + h_0 x(t), \\ t &= 0, s, 2s, \ldots \end{cases} \quad (27)$$

The matrixes G, e1, h, q(t) and q(0) may be defined by formulae 28, 29, 30, 31 and 32 respectively as follows:

$$G = \begin{pmatrix} g_1 & g_2 & \cdots & g_{m-1} & g_m \\ 1 & 0 & \cdots & 0 & 0 \\ 0 & 1 & \cdots & 0 & 0 \\ \vdots & \vdots & & \vdots & \vdots \\ 0 & 0 & \cdots & 1 & 0 \end{pmatrix} \quad (28)$$

$$e_1 = \begin{pmatrix} 1 \\ 0 \\ \vdots \\ 0 \end{pmatrix} \quad (29)$$

$$h = (h_1, \ldots, h_m) \quad (30)$$

$$q(t) = \begin{pmatrix} q_1(t) \\ \vdots \\ q_m(t) \end{pmatrix} \quad (31)$$

$$q^{(0)} = \begin{pmatrix} q_1^{(0)} \\ \vdots \\ q_m^{(0)} \end{pmatrix}. \quad (32)$$

At time t+2, vector q(t+2) may be given by formulae 33 as follows:

$$\begin{aligned} q(t+2) &= G \cdot (G \cdot q(t) + e_1 x(t)) + e_1 x(t+1) \\ &= G^2 \cdot q(t) + (G \cdot e_1) x(t) + e_1 x(t+1) \end{aligned} \quad (33)$$

By induction, formula 34 may be as follows:

$$q(t+s) = G^s \cdot q(t) + b^{(s-1)} x(t) + \ldots + b^{(0)} x(t+s)-1) \quad (34)$$

where $b^{(i)} = G^i \cdot e_1$, may be obtained for any time t+s, where b(i) may be a first column of matrix Gi. In matrix form, q may be expressed by formula 35 as follows:

$$q(t+s) = A^{(s)} \cdot q(t) + B^{(s)} x^{(s)}(t), \text{ where} \quad (35)$$

$$A^{(s)} = (a_{ij}^{(s)})_{m \times m} = G^s,$$

$$B^{(s)} = (b_{ij}^{(s)})_{m \times s} = (b^{(s-1)}, b^{(s-2)}, \ldots b^{(0)}),$$

$$x^{(s)}(t) = \begin{pmatrix} x(t) \\ \vdots \\ x(t+s-1) \end{pmatrix}.$$

A relation between Y(s)(t) and q(t), X(s)(t) may be expressed by formula 36 as follows:

Formulae 37:

$$y^{(s)}(t) = \begin{pmatrix} y(t) \\ \vdots \\ y(t+s-1) \end{pmatrix}. \quad (36)$$

$$y(t+i-1) = h_0 \ldots x(t+i-1) + \sum_{l=1}^{m} h_l q_l(t+i-1) = \quad (37)$$

$$h_0 x(t+i-1) + \sum_{l=1}^{m} \sum_{j=1}^{m} h_l a_{ij}^{(i-1)} q_j(t) + \sum_{l=1}^{m} \sum_{j=1}^{s} h_l b_{ij}^{(i-1)} x(t+j-1) =$$

$$\sum_{j=1}^{m} \left( \sum_{l=1}^{m} h_l a_{ij}^{(i-1)} \right) q_j(t) + \sum_{j=1}^{s} \left( h_0 \delta_{ij} + \sum_{l=1}^{m} h_l b_{ij}^{(i-1)} \right) x(t+j-1) c$$

may apply for i=1, ..., s, where $\delta_{ij}$ may be 1 if i=j and 0 (zero) otherwise. The vector Y may be written in matrix form in formula 38 as follows:

$$y^{(s)}(t) = C^{(s)} \cdot q(t) + D^{(s)} \cdot x^{(s)}(t), \text{ where} \quad (38)$$

$$C^{(s)} = (c_{ij}^{(s)})_{s \times m}, c_{ij}^{(s)} = \sum_{l=1}^{m} h_l a_{ij}^{(i-1)}$$

$$D^{(s)} = (d_{ij}^{(s)})_{s \times s}, d_{ij}^{(s)} = h_0 \delta_{ij} + \sum_{l=1}^{m} h_l b_{ij}^{(i-1)}$$

Therefore, formulae 39:

$$\begin{cases} q(0) &= q^{(0)}, \\ q(t+s) &= A^{(s)} \cdot q(t) + B^{(s)} \cdot x^{(s)}(t), \\ y^{(s)}(t) &= C^{(s)} \cdot q(t) + D^{(s)} \cdot x^{(s)}(t), \\ t &= 0, s, 2s, \ldots \end{cases} \quad (39)$$

may be implemented for the encoder to operate s times faster.

Consider a convolutional rate 1/n encoder to be universal where the encoder supports any transfer matrix T with a maximum constraint length L (e.g., number of delays in encoder). In order to implement an s times faster version of such a universal encoder, the binary matrixes A(S), B(S) and n different pairs of matrixes C(S), D(S) (e.g., a pair of matrixes for each of n outputs) may be calculated using the previous formulae. For the case n=1, four matrixes may be generated. For other cases, the sizes of matrixes generally increase as the parameter s increases (e.g., the number of input bits per clock cycle). Therefore, all the elements of matrixes may be initialized and stored in a configuration register.

Figure 6:
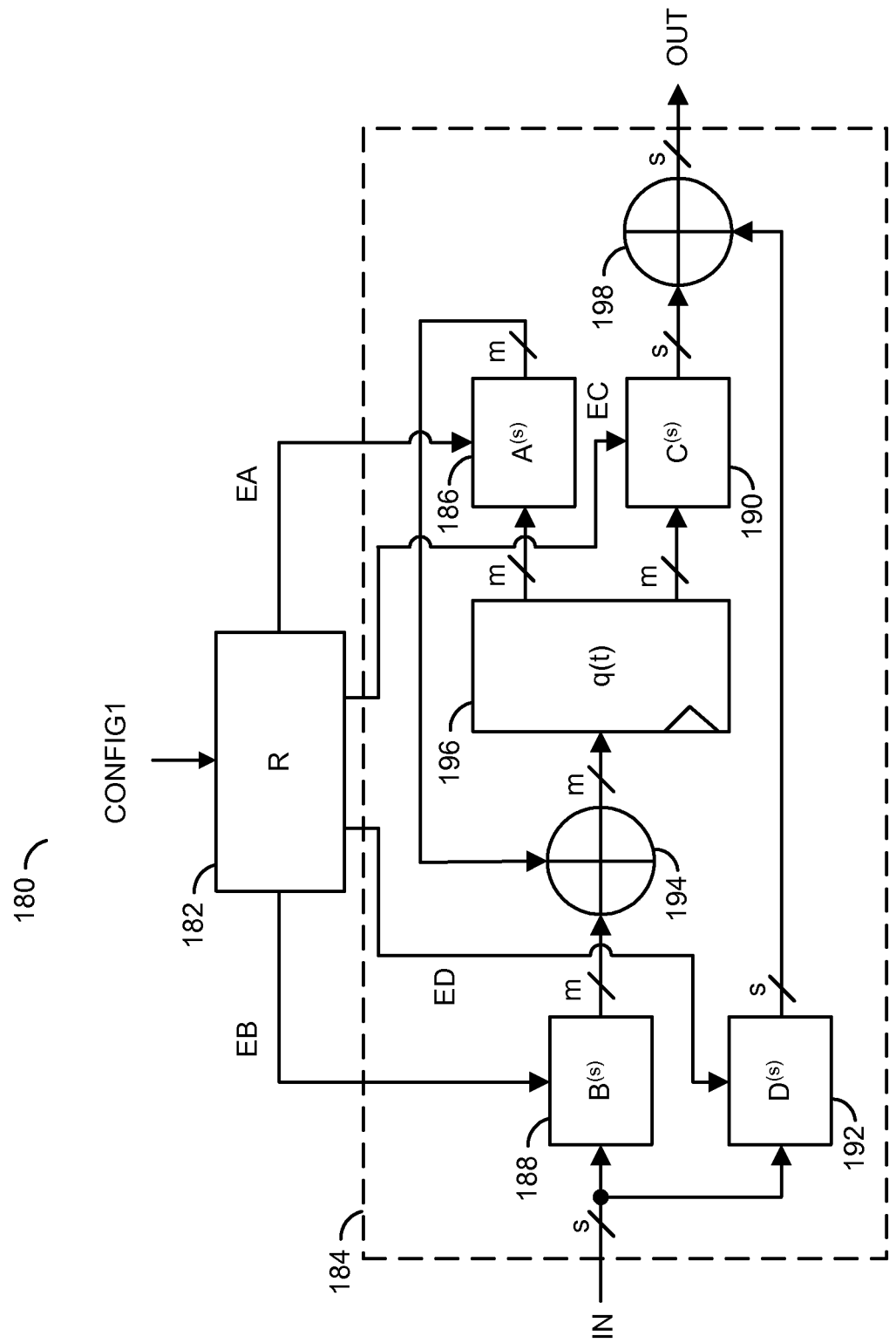
FIG. 6 is a block diagram of a convolutional and/or turbo encoder.

Referring to FIG. 6, a block diagram of an apparatus 180 is shown. The apparatus (or device or circuit) 180 may implement a convolutional and/or turbo encoder. The apparatus 180 generally comprises a circuit (or module) 182 and a circuit (or module) 184. The circuit 184 generally comprises a circuit (or module) 186, a circuit (or module) 188, a circuit (or module) 190, a circuit (or module) 192, a circuit (or module) 194, a circuit (or module) 196 and a circuit (or module) 198. The circuits 182 to 198 may represent modules and/or blocks that may be implemented as hardware, firmware, software, a combination of hardware, firmware and/or software, or other implementations.

The signal IN may be received by the circuits 188 and 192. The signal OUT may be generated by the circuit 198. A signal (e.g., CONFIG1) may be received by the circuit 182. The circuit 182 may generate a signal (e.g., EA) received by the circuit 186. A signal (e.g., EB) may also be generated by the circuit 182 and received by the circuit 188. The circuit 182 may generate a signal (e.g., EC) received by the circuit 190. A signal (e.g., ED) may be generated by the circuit 182 and received by the circuit 192.

The circuit 182 may implement a configuration register circuit. The circuit 182 may be operational to store a set of matrix elements used by the circuit 184. A particular set of matrix elements may be loaded into the circuits 186, 188, 190 and 192 for encoding according to a particular communications standard. The particular set of matrix elements may be received in the signal CONFIG1 from a source external to the apparatus 180. In some embodiments of the present invention, the source may be implemented as a software driver. Other sources of the configuration information (e.g., matrix elements) may be implemented to meet the criteria of a particular application.

The circuit 184 may implement an encoder circuit. The circuit 184 is generally operational to generate the signal OUT by encoding the signal IN. Encoding may be performed to the communications standard defined by the matrix elements received in the signals EA, EB; EC and ED. The signal IN may convey the sequence of input vectors X(S)(t).

Each circuit 186, 188, 190 and 192 may implement a matrix multiplication circuit. The circuits 186 to 192 are generally operational to multiply a word (e.g., vector) by the respective matrix elements to generate another vector.

The circuit 188 may multiply an information word (e.g., X(i)(t)) as received in the signal IN by the matrix (e.g., B(S)) received in the signal EB. The resulting vector may be transferred to the circuit 194.

The circuit 194 may implement an adder circuit. The circuit 192 is generally operational to add the vector received from the circuit 188 with a vector generated by the circuit 186. The sum vector may be presented to the circuit 196.

The circuit 196 may implement a register circuit. The circuit 196 may be operational to buffer the sum vector generated by the circuit 194. Buffering may last for a single clock cycle. On the next clock cycle, the buffered sum vector may be transferred to the circuits 186 and 190.

The circuit 186 may multiply the vector received from the circuit 196 by the matrix (e.g., A(S)) received in the signal EA. The resulting vector may be feed back to the circuit 194. The circuit 190 may multiply the vector received from the circuit 196 by the matrix (e.g., C(S)) received in the signal EC. The resulting vector may be transferred to the circuit 198. The circuit 192 may multiply the vector received in the signal IN by the matrix (e.g., D(S)) received in the signal ED. The resulting vector may be transferred to the circuit 198.

The circuit 198 may implement another adder circuit. The circuit 198 is generally operational to generate the sequence of output vectors Y(S)(t) in the signal OUT by adding the vectors received from the circuits 190 and 192.

Figure 7:
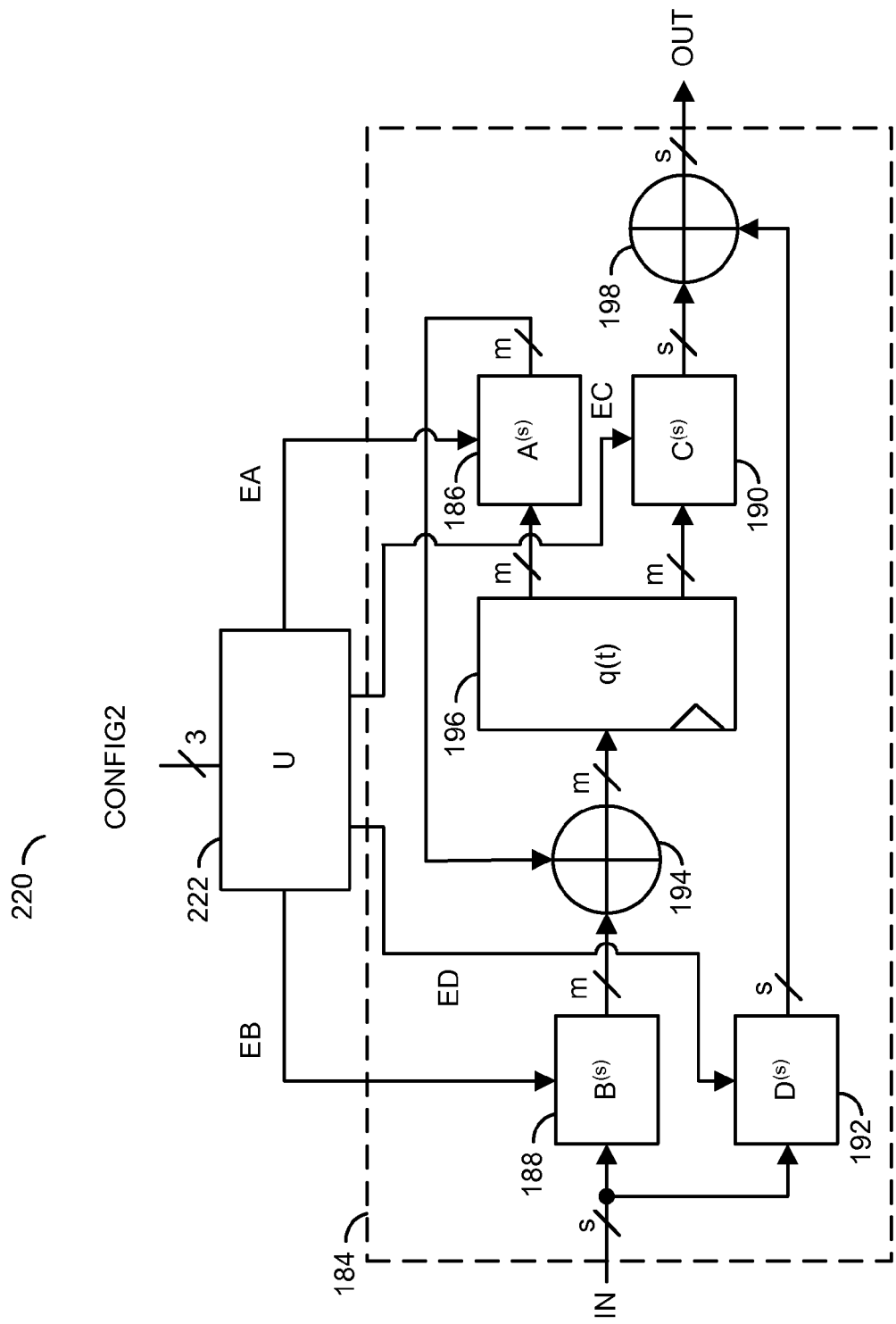
FIG. 7 is a block diagram of an apparatus in accordance with a preferred embodiment of the present invention.

Referring to FIG. 7, a block diagram of an apparatus 220 is shown in accordance with a preferred embodiment of the present invention. The apparatus (or device or circuit) 220 may implement an encoder with a universal multipole. The apparatus 220 generally comprises the circuit 184 and a circuit (or module) 222. The circuit 222 generally replaces the circuit 182 in the apparatus 180. The circuit 222 may receive a signal (e.g., CONFIG2). The signal CONFIG2 may be a limited number of bits (e.g., J1, J2 and J3). The circuits 184 to 222 may represent modules and/or blocks that may be implemented as hardware, firmware, software, a combination of hardware, firmware and/or software, or other implementations.

The circuit 222 may implement a universal multipole circuit. The circuit 222 is generally operational to calculate the binary matrix elements for the matrixes A(S), B(S), C(S) and D(S) based on the signal CONFIG2. An architecture of the apparatus 220 in the case when n=1 is illustrated in FIG. 7. The general case implements n pairs of matrixes C(S), D(S).

A Boolean chain for functions of n variables is generally a sequence of steps where each step combines the results from two previous steps. A Boolean chain that includes all functions of the n variables may be referred to as a universal multiple. The universal multipole for variables J1, J2, . . . , Jn is generally a scheme with n inputs and $2^{(2^n)}$ outputs. The universal multipole may implement the $2^{(2^n)}$ outputs using all Boolean functions on the variables J1, J2, . . . , Jn. A universal multipole may be constructed by common techniques using no more than $2^{(2^n)}$ elements from the set of all Boolean logical operations of two variables {AND, OR, NOT, . . . }. Additional information may be found in "The Art of Computer Programming", volume 4, Pre-Fascicle 0C, by Donald E. Knuth, section 7.1.2: Boolean Evaluation, pages 0-61, copyright 2006 by Addison-Wesley, which is hereby incorporated by reference in its entirety.

Let v be the number of different convolutional and turbo codes used in a chosen set of wireless standards (e.g., LTE, W-CDMA, CDMA-2000). Usually the number v has a small value (e.g., v<8) and so each code used in the set of communications standards may be identified as a multi-bit (e.g., 3-bit) vector J=(J1, J2, J3). Each element of the matrixes A(S), B(S), C(S) and D(S) may be represented as a Boolean function f(J1, J2, J3). Therefore, a universal multipole U for variables J1, J2, J3 may be implemented by the circuit 222.

All of the matrix elements of the matrixes A(S), B(S), C(S) and D(S) may be calculated by the circuit 222. In some embodiments, the matrix elements for the matrix A(S) may be presented in the signal EA, the matrix elements for the matrix B(S) in the signal EB, the matrix elements for the matrix C(S) in the signal EC and the matrix elements for the matrix D(S) in the signal ED. In such cases, configuration (or reconfiguration) of the apparatus 220 to encode in accordance with a particular communications standard generally involves loading the vector J to a register in the circuit 222. The vector J may carry the corresponding 3-bit vector for the particular communications standard. Loading the vector J into a register and calculating the subsequent matrix elements may be performed in a single clock cycle for a hardware-only implementation of the circuit 222. Thus, reconfiguration of the apparatus 220 may be accomplished in the single clock cycle.

The apparatus 180 and the apparatus 220 generally allow processing of several (e.g., up to 8) information bits per clock cycle. The circuit 222 of the apparatus 220 may not implement a large buffer to store large amounts of configuration data and so may quickly configured the circuit 184. Moreover, reconfiguration may be made on-the-fly in a single clock without support from external driver software and/or circuitry.

The functions performed by the diagrams of FIGS. 1 to 7 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally executed from a medium or several media by one or more of the processors of the machine implementation.

The present invention may also be implemented by the preparation of ASICs (application specific integrated circuits), Platform ASICs, FPGAs (field programmable gate arrays), PLDs (programmable logic devices), CPLDs (complex programmable logic device), sea-of-gates, RFICs (radio frequency integrated circuits), ASSPs (application specific standard products), monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, storage and/or playback devices, video recording, storage and/or playback devices, game platforms, peripherals and/or multi-chip modules. Those skilled in the relevant art(s) would understand that the elements of the invention may be implemented in other types of devices to meet the criteria of a particular application.

As would be apparent to those skilled in the relevant art(s), the signals illustrated in FIGS. 6 and 7 represent logical data flows. The logical data flows are generally representative of physical data transferred between the respective blocks by, for example, address, data, and control signals and/or busses. The system represented by the apparatuses 180 and 220 may be implemented in hardware, software or a combination of hardware and software according to the teachings of the present disclosure, as would be apparent to those skilled in the relevant art(s).

While the invention has been particularly shown and described with reference to the preferred embodiments thereof, it will be understood by those skilled in the art that various changes in form and details may be made without departing from the scope of the invention.

The invention claimed is:

1. An apparatus comprising:
    a first circuit configured to (i) receive a configuration signal that identifies a current one of a plurality of communications standards and (ii) generate a plurality of matrix elements based on said configuration signal; and
    a second circuit comprising a plurality of matrixes and configured to (i) fill said matrixes with said matrix elements and (ii) generate an encoded signal by forward error correction encoding an input signal using said matrixes, wherein said encoded signal complies with said current communications standard.

2. The apparatus according to claim 1, wherein said first circuit is further configured to reconfigure said second circuit among said communications standards in response to a change said configuration signal.

3. The apparatus according to claim 2, wherein said reconfiguration is accomplished in one clock cycle.

4. The apparatus according to claim 1, wherein said matrixes receive a plurality of information bits of said input signal per clock cycle.

5. The apparatus according to claim 1, wherein said second circuit comprises at least four of said matrixes.

6. The apparatus according to claim 1, wherein said matrix elements are generated using a plurality of Boolean logical operations operating on said configuration signal.

7. The apparatus according to claim 1, wherein said encoding comprises a turbo encoding.

8. The apparatus according to claim 1, wherein said encoding comprises a convolutional encoding.

9. The apparatus according to claim 1, wherein said communications standards include at least two of (i) a Long Term Evolution (LTE) standard, (ii) an Institute of Electrical and Electronics Engineering (IEEE) 802.16 standard, (iii) a Wideband-CDMA/High Speed Packet Access (WCDMA/HSPA) standard and (iv) a CDMA-2000/Ultra Mobile Broadband (UMB) standard.

10. The apparatus according to claim 1, wherein said apparatus is implemented as one or more integrated circuits.

11. A method for encoding an input signal per a plurality of communications standards, comprising the steps of:
    (A) receiving at a circuit a configuration signal that identifies a current one of said communications standards;
    (B) generating a plurality of matrix elements based on said configuration signal;
    (C) filling a plurality of matrixes with said matrix elements; and
    (D) generating an encoded signal by forward error correction encoding said input signal using said matrixes, wherein said encoded signal complies with said current communications standard.

12. The method according to claim 11, further comprising the step of:
    reconfiguring among said communications standards in response to a change in said configuration signal.

13. The method according to claim 12, wherein said reconfiguring is accomplished in one clock cycle.

14. The method according to claim 11, wherein said matrixes receive a plurality of information bits of said input signal per clock cycle.

15. The method according to claim 11, wherein said forward error correction encoding utilizes at least four of said matrixes.

16. The method according to claim 11, wherein said matrix elements are generated using a plurality of Boolean logical operations operating on said configuration signal.

17. The method according to claim 11, wherein said encoding comprises a turbo encoding.

18. The method according to claim 11, wherein said encoding comprises a convolutional encoding.

19. The method according to claim 11, wherein said communications standards include at least two of (i) a Long Term Evolution (LTE) standard, (ii) an Institute of Electrical and Electronics Engineering (IEEE) 802.16 standard, (iii) a Wideband-CDMA/High Speed Packet Access (WCDMA/HSPA) standard and (iv) a CDMA-2000/Ultra Mobile Broadband (UMB) standard.

20. An apparatus comprising:
means for receiving a configuration signal that identifies a current one of a plurality of communications standards;
means for generating a plurality of matrix elements based on said configuration signal;
means for filling a plurality of matrixes with said matrix elements; and
means for generating an encoded signal by forward error correction encoding an input signal using said matrixes, wherein said encoded signal complies with said current communications standard.

* * * * *